United States Patent [19]
Hirano et al.

[11] Patent Number: 5,828,619
[45] Date of Patent: Oct. 27, 1998

[54] SEMICONDUCTOR MEMORY DEVICE

[75] Inventors: Hiroshige Hirano, Nara; Masaya Okada, Osaka, both of Japan

[73] Assignee: Matsushita Electric Industrial Co., Ltd., Osaka, Japan

[21] Appl. No.: 635,869

[22] Filed: Apr. 18, 1996

[30] Foreign Application Priority Data

Apr. 18, 1995 [JP] Japan ..................................... 7-092038

[51] Int. Cl.$^6$ ................................................. G11C 1/406
[52] U.S. Cl. ........................................... 365/222; 365/233
[58] Field of Search .................................... 365/222, 233, 365/191, 193

[56] References Cited

U.S. PATENT DOCUMENTS

| | | | |
|---|---|---|---|
| 5,321,662 | 6/1994 | Ogawa ..................................... | 365/222 |
| 5,495,452 | 2/1996 | Cha ......................................... | 365/222 |
| 5,515,331 | 5/1996 | Kim ........................................ | 365/222 |

FOREIGN PATENT DOCUMENTS

| | | |
|---|---|---|
| 0 301 794 | 2/1989 | European Pat. Off. . |
| 0 632 463 | 1/1995 | European Pat. Off. . |
| 64-13292 | 1/1989 | Japan . |
| WO 94/12934 | 6/1994 | WIPO . |

OTHER PUBLICATIONS

IBM Technical Disclosure Bulletin, vol. 33, No. 2, Jul. 1990, pp. 68–72,, "Intelligent DRAM Refresh Controller".

*Primary Examiner*—David C. Nelms
*Assistant Examiner*—Vu A. Le
*Attorney, Agent, or Firm*—McDermott, Will & Emery

[57] ABSTRACT

In a DRAM, an external cycle count circuit detects an operation cycle of a signal RAS which is externally inputted, and a signal expressing the result is outputted to a CBR signal generating circuit and a self refresh signal generating circuit. In response to outputs from the respective signal generating circuits, an internal RAS signal generating circuit outputs a refresh instruction signal INRAS for CBR refresh and self refresh. For self refresh, as the operation cycle of the signal RAS immediately before self refresh begins, a refresh cycle is set longer. For CBR refresh, when the operation cycle of the signal RAS is long, a CBR refresh instruction signal is generated in accordance with only a part of an operation of the signal RAS. By reducing the frequency of refresh, consumption power is reduced. By means of control which considers a parameter which influences an internal temperature of a semiconductor memory device such as a DRAM, consumption power is reduced and an operation speed is improved.

13 Claims, 7 Drawing Sheets

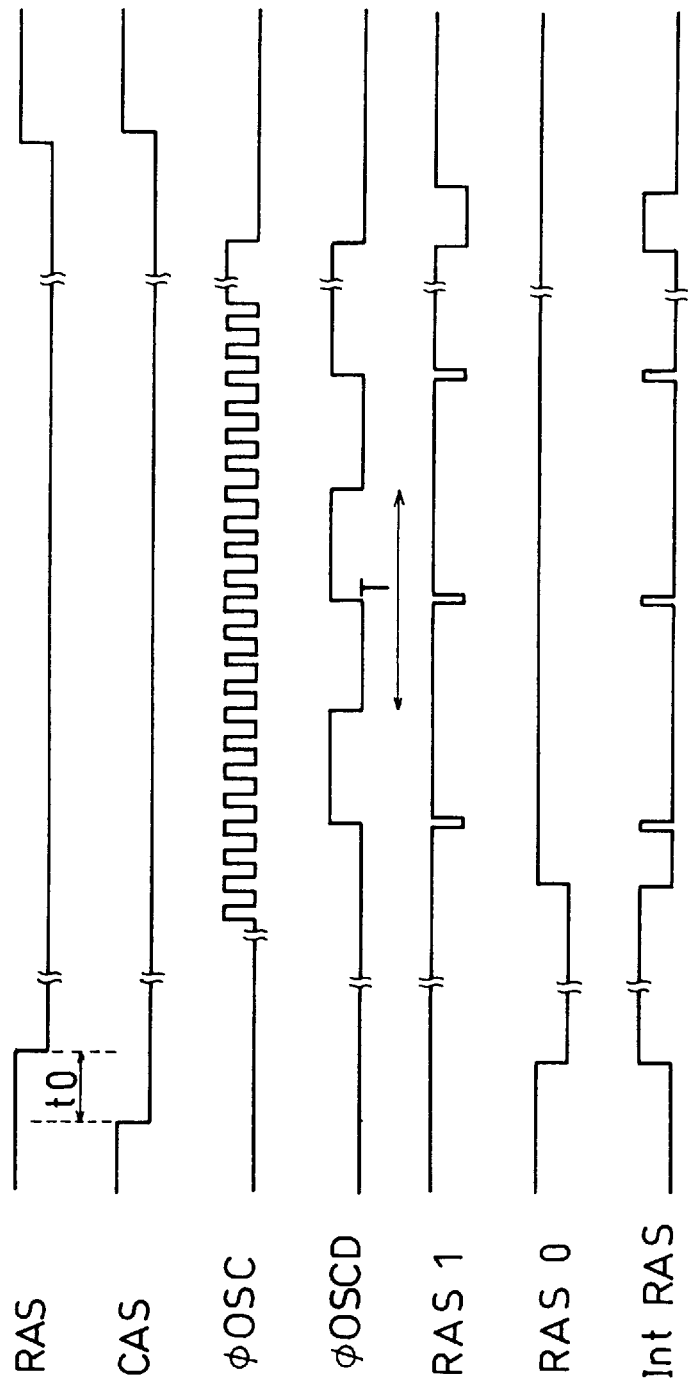

SEMICONDUCTOR MEMORY DEVICE

BACKGROUND OF THE INVENTION

The present invention relates to a semiconductor memory device having a refresh function, such as a DRAM, and more particularly, to a reduction in electric power which is expended during a refresh operation.

Conventionally, dynamic type semiconductor memory devices such as a DRAM have various types of refresh functions, considering that there is a limit to a holding time for holding stored data. For example, there are a RAS only refresh function for performing a refresh operation by externally inputting a refresh row address and a control signal RAS (row address strobe signal), a CAS before RAS auto-refresh (CBR refresh) function which requires to input two types of control signals RAS and CAS (column address strobe signal) and generate a refresh address within a semiconductor memory device, a self refresh function in which a semiconductor memory devices itself generates a control signal and a refresh address which are needed for a refresh operation asynchronously to an externally inputted signal, etc.

Now, a self refresh function for a conventional DRAM disclosed in Japanese Laid-Open Patent Application Gazette No. 1-13292 will be briefly described.

FIG. 6 is a block circuitry diagram showing a part of a conventional semiconductor memory device which performs a self refresh function, and FIG. 7 is a signal timing chart of various parts of the conventional semiconductor memory device of FIG. 6. Disposed within a semiconductor memory device 1 are a self refresh control circuit 3, an oscillating circuit 4, a frequency-divider circuit 5, an external RAS input control circuit 6, an internal RAS generation control circuit 7, an internal address counter control circuit 8, an internal address counter circuit 9, an NOR circuit 16, and a NAND circuit 17. The semiconductor memory device 1 includes other circuits in addition to those shown in the drawings. Denoted at ΦOSC is a signal at a point A, denoted at ΦOSCD is a signal at a point B, denoted at RAS0 is a signal at a point C, denoted at RAS1 is a signal at a point D, and denoted at IntRAS is a signal at a point E.

The signals flow in the circuit of FIG. 6 in the following manner. A signal RAS is supplied to the self refresh control circuit 3 and the external RAS input control circuit 6, a signal CAS is supplied to the self refresh control circuit 3, the internal address counter control circuit 8 and the NOR circuit 16. The oscillating circuit 4 generates a signal ΦOSC, in response to an output signal from the self refresh control circuit 3. The signal ΦOSC is supplied to the frequency-divider circuit 5. The frequency-divider circuit 5 divides the signal ΦOSC to generate a signal ΦOSCD. The signal ΦOSCD is supplied to the internal RAS generation control circuit 7, while other signal is supplied from the frequency-divider circuit 5 to the external RAS input control circuit 6. A signal RAS0 which is generated by the external RAS input control circuit 6 and a signal RAS1 which is generated by the internal RAS generation control circuit 7 are supplied to the NAND circuit 17. The NAND circuit 17 generates a signal IntRAS. The signal IntRAS is supplied to the internal address counter control circuit 8. Meanwhile, the NAND circuit 17 supplies other signal as an internal signal RAS. Further, a signal which is generated by the internal address counter control circuit 8 is supplied to the internal address counter circuit 9 and the NOR circuit 16. The NOR circuit 16 generates an internal CAS signal.

FIG. 7 is a timing chart showing an example of timing at which the respective signals above operate. After a certain time t0 since the CAS signal changes to a logic voltage "L," the RAS signal changes to the logic voltage "L." Following this, after a certain time, the IntRAS signal is generated as a signal which is asynchronous to the external signal. Using the IntRAS signal and an internal address from the internal address counter, a self-refresh is sequentially operated.

In such a conventional semiconductor memory device having a self refresh function, a signal ΦOSCD is outputted in a constant cycle T from the frequency-divider circuit 5, the signal RAS1 is outputted from the internal RAS generation control circuit 7 in response to this signal, and further, a refresh operation is performed in response to the signal IntRAS, i.e., a internal RAS signal, which is outputted from the NOR circuit 17. Thus, since the signal ΦOSCD which is generated by the frequency-divider circuit 5 has a constant cycle, a self refresh cycle for a self refresh operation is set constant, regardless of a normal operation condition before the self refresh operation.

By the way, when an operation cycle for normal operations is short, i.e., in a high-speed operation condition, since a consumption current during operations increases, an internal temperature of the device increases. Due to a characteristic of a memory cell which utilizes a capacitance, as the internal temperature of the device increases, a data holding time becomes shorter. Hence, in the conventional semiconductor memory device having a self-refresh function, a self refresh cycle is set within a predetermined range which is known by experiences as not causing data to be lost. This cycle corresponds to a data holding time of when an operation under a condition in which the internal temperature of the device becomes highest, i.e., the normal operation condition before the self refresh operation, are high-speed operation. Because of this, in the conventional semiconductor memory device, self refresh is performed in a short cycle despite a fact that the normal operation is not performed at a high speed and a data holding time is sufficiently long, which results in an unnecessary consumption current during self refresh.

Except for such an example as above, in a semiconductor memory device, since a parameter which influences a temperature characteristic is not sufficiently considered, there is a great waste in consumption power, an operation speed, etc.

SUMMARY OF THE INVENTION

The present invention has been made noting such points. Accordingly, an object of the present invention is to grasp a parameter which influences a temperature characteristic and to operate a semiconductor memory device in accordance with the parameter, to thereby improve the performance of the semiconductor memory device, including a reduction in consumption power and an improvement in an operation speed.

A first semiconductor memory device according to the present invention comprises: a memory part; a control part for controlling writing of data in the memory part, reading of data from the memory part, erasion of data, holding of data and the like in response to a signal which is externally inputted; and operation cycle detecting means for detecting an operation cycle of the signal which is externally inputted.

When the first semiconductor memory device is a DRAM, the control part is structured so as to perform a RAS only refresh operation in response to a signal RAS which is externally inputted, and the operation cycle detecting means is structured so as to detect an operation cycle of the signal RAS during the RAS only refresh operation.

When the first semiconductor memory device is a DRAM, the control part is structured so as to perform a CAS before RAS auto-refresh (CBR refresh) operation in response to a signal RAS which is externally inputted, and the operation cycle detecting means is structured so as to detect an operation cycle of the signal RAS during the CAS before RAS auto-refresh operation.

One of parameters influencing an internal temperature of a semiconductor memory device is a frequency of operations by the control part within the device. Since the operation cycle detecting means disposed within such a structure as above detects the operation cycle of the externally inputted signal which instructs the control part to operate, the semiconductor memory device is controlled considering the temperature dependence thereof.

A second semiconductor memory device which functions as a DRAM according to the present invention comprises: a memory part; a control part for controlling writing of data in the memory part, reading of data from the memory part, holding of data and the like in accordance with a signal which is externally inputted; and self refresh means for performing refresh asynchronously to the signal which is externally inputted, wherein the self refresh means gradually extends each self refresh cycle after a certain period of time during a self refresh operation.

This allows a cycle of a self refresh instruction signal to become gradually longer after a certain period of time during the self refresh operation. On the other hand, while the internal temperature of the device increases during the refresh operation, as the self refresh cycle becomes longer, the internal temperature of the device gradually decreases to thereby extend a data holding time. Hence, by gradually extending the self refresh cycle, it is possible to reduce consumption power while maintaining a data holding function.

A third semiconductor memory device which functions as a DRAM according to the present invention comprises: a memory part; a control part for controlling writing of data in the memory part, reading of data from the memory part, holding of data and the like in response to a signal which is externally inputted; operation cycle detecting means for detecting an operation cycle of the signal which is externally inputted; and self refresh means for performing refresh asynchronously to the signal which is externally inputted, wherein the self refresh means selects one of the plurality of self refresh cycles in accordance with an operation cycle of the externally inputted signal which is detected by the operation cycle detecting means during a self refresh operation.

In the third semiconductor memory device, the self refresh means is structured to select a longer self refresh cycle as the operation cycle of the signal which is externally inputted is longer.

This allows to change the self refresh cycle in accordance with the operation cycle of the externally inputted signal which influences the internal temperature of the semiconductor memory device, so that consumption power during the self refresh operation is reduced by means of simple and quick controlling.

A fourth semiconductor memory device which functions as a DRAM according to the present invention comprises: a memory part; a control part for controlling writing of data in the memory part, reading of data from the memory part, holding of data and the like in response to a signal which is externally inputted; operation cycle detecting means for detecting an operation cycle of the signal which is externally inputted; and self refresh means for performing refresh asynchronously to the signal which is externally inputted, wherein the self refresh means selects one of the plurality of self refresh cycles in accordance with an operation cycle of the externally inputted signal which is detected by the operation cycle detecting means at the beginning of a self refresh operation, and gradually extends each self refresh cycle after a certain period of time during the self refresh operation.

In such a structure, it is possible to largely reduce consumption power.

A fifth semiconductor memory device which functions as a DRAM according to the present invention comprises: a memory part; a control part for controlling writing of data in the memory part, reading of data from the memory part, holding of data and the like in response to a signal which is externally inputted; operation cycle detecting means for detecting an operation cycle of the signal which is externally inputted; and CBR refresh means for performing CBR refresh in a basic cycle which is determined in accordance with an operation cycle of the externally inputted signal, wherein in response to the specific operation cycle of the externally inputted signal which is detected by the operation cycle detecting means during a CBR refresh operation, the CBR refresh means performs the CBR refresh operation in a cycle which is obtained by changing the basic cycle.

In the fifth semiconductor memory device, the CBR refresh means can be structured so as to change a cycle for performing the CBR refresh operation more largely than a change in the operation cycle which is detected by the operation cycle detecting means.

In such a structure, when the operation cycle of the externally inputted signal which influences the internal temperature of the semiconductor memory device changes, the cycle of the CBR refresh operation which is determined in accordance with the operation cycle of the externally inputted signal is reduced more largely than a change in the operation cycle of the externally inputted signal, for instance. Hence, it is possible to control the CBR refresh operation considering a change in the internal temperature of the semiconductor memory device, and to reduce consumption power during CBR refresh.

A sixth semiconductor memory device according to the present invention comprises: a memory part; a control part for controlling writing of data in the memory part, reading of data from the memory part, erasion of data, holding of data and the like in response to a signal which is externally inputted; operation cycle detecting means for detecting an operation cycle of the signal which is externally inputted; refresh means for performing refresh for holding data which are stored in the memory part; and instruction signal generating means for generating a refresh instruction signal which operates the refresh means, wherein the instruction signal generating means changes a cycle of the refresh instruction signal so that a frequency of refresh becomes smaller as an operation cycle of the externally inputted signal which is detected by the operation cycle detecting means becomes longer.

In such a structure, the frequency of the refresh operation changes depending on the operation cycle of the externally inputted signal, so that the frequency of the refresh operation becomes smaller as the operation cycle of the externally inputted signal becomes longer. In general, a semiconductor memory device has a characteristic that an internal temperature of the semiconductor memory device becomes low when the device operates at a low speed, and a data holding time of the semiconductor memory device becomes longer when the internal temperature of the device is low. Hence, even if the frequency of the refresh operation is reduced in a low-speed operation condition with a long operation cycle to extend a refresh cycle, data are not lost. Therefore, by reducing the frequency of the refresh operation during operations at a low speed, consumption power is reduced. Since a reduction in consumption power prevents the internal temperature of the device from increasing, the data holding time becomes even longer. Thus, by reducing the frequency of the refresh operation, it is possible to reduce consumption power while maintaining a data holding function.

BRIEF DESCRIPTION OF THE DRAWINGS

FIG. 7 is a timing chart of each signal in the conventional semiconductor memory device.

DESCRIPTION OF PREFERRED EMBODIMENTS

In the following, a preferred embodiment of the present invention will be described with reference to the drawings.

Figure 1:
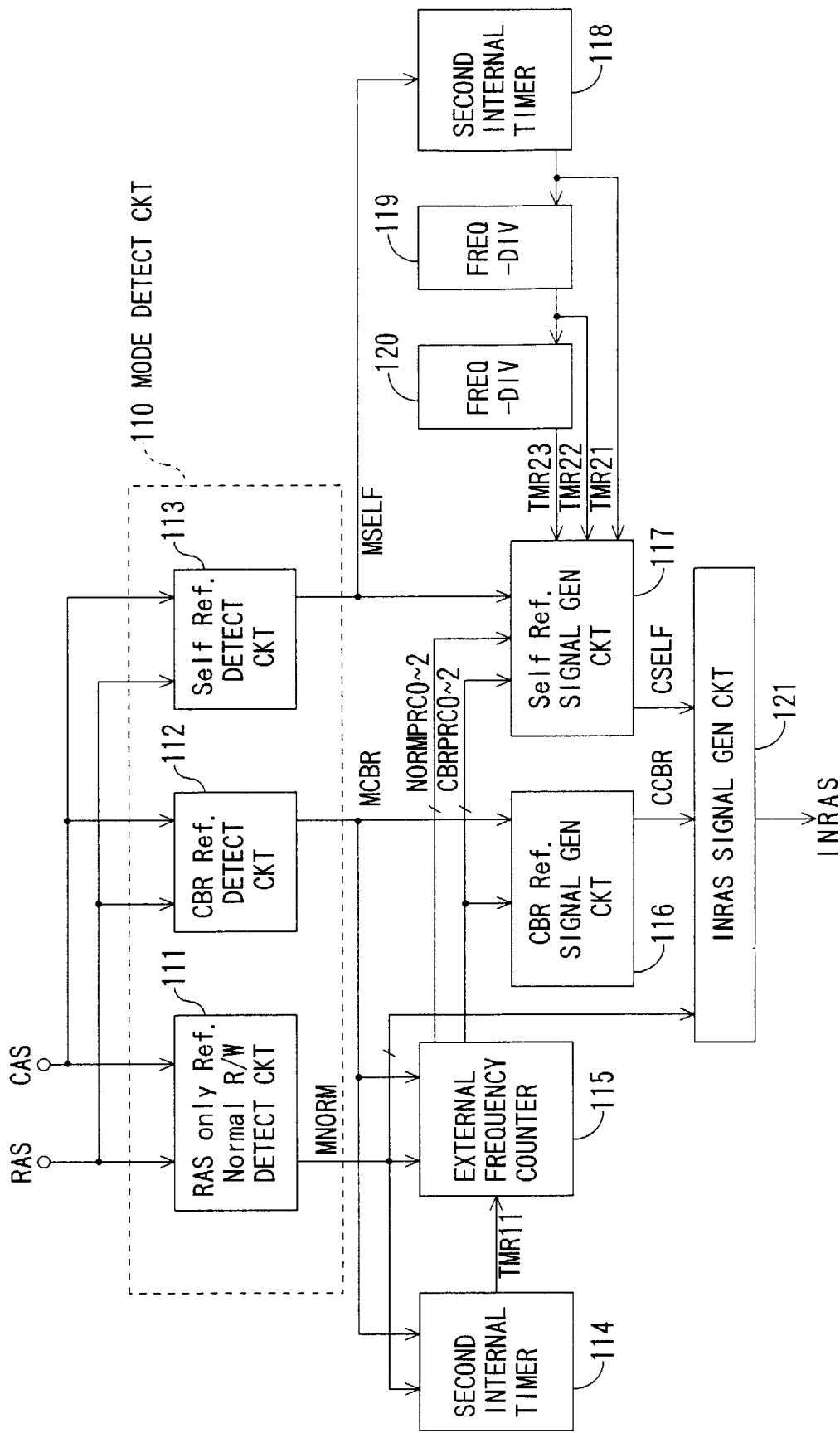
FIG. 1 is a block diagram showing a structure of a part of a semiconductor memory device which performs a self refresh function and a CBR self refresh function according to a preferred embodiment.

FIG. 1 is a block diagram showing a structure of a part of a semiconductor memory device which performs a self refresh function and a CBR self refresh function.

As shown in FIG. 1, a mode detection circuit 110 for detecting an operation mode includes a RAS only refresh and normal read/write detection circuit 111 (abbreviated as "RAS only Ref. Normal R/W DETECT CKT" in FIG. 1), a CBR refresh detection circuit 112 (abbreviated as "CBR Ref DETECT CKT" in FIG. 1), and a self refresh detection circuit 113 (abbreviated as "Self Ref. DETECT CKT" in FIG. 1). On the output side of the mode detection circuit 110, there are disposed a first and a second internal timers 114 and 118, an external cycle count circuit 115, a CBR refresh signal generating circuit 116 (abbreviated as "CBR Ref. SIGNAL GEN CKT" in FIG. 1), a self refresh signal generating circuit 117 (abbreviated as "Self Ref. SIGNAL GEN CKT" in FIG. 1), two frequency-divider circuits 119 and 120, and an internal RAS signal generating circuit 121. The symbols RAS, CAS, MNORM, MCBR, MSELF, TMR11, TMR21–23, NORMPROC0–2, CBRPRC0–2, CCBR, CSELF, and INRAS denote signals.

Figure 2:
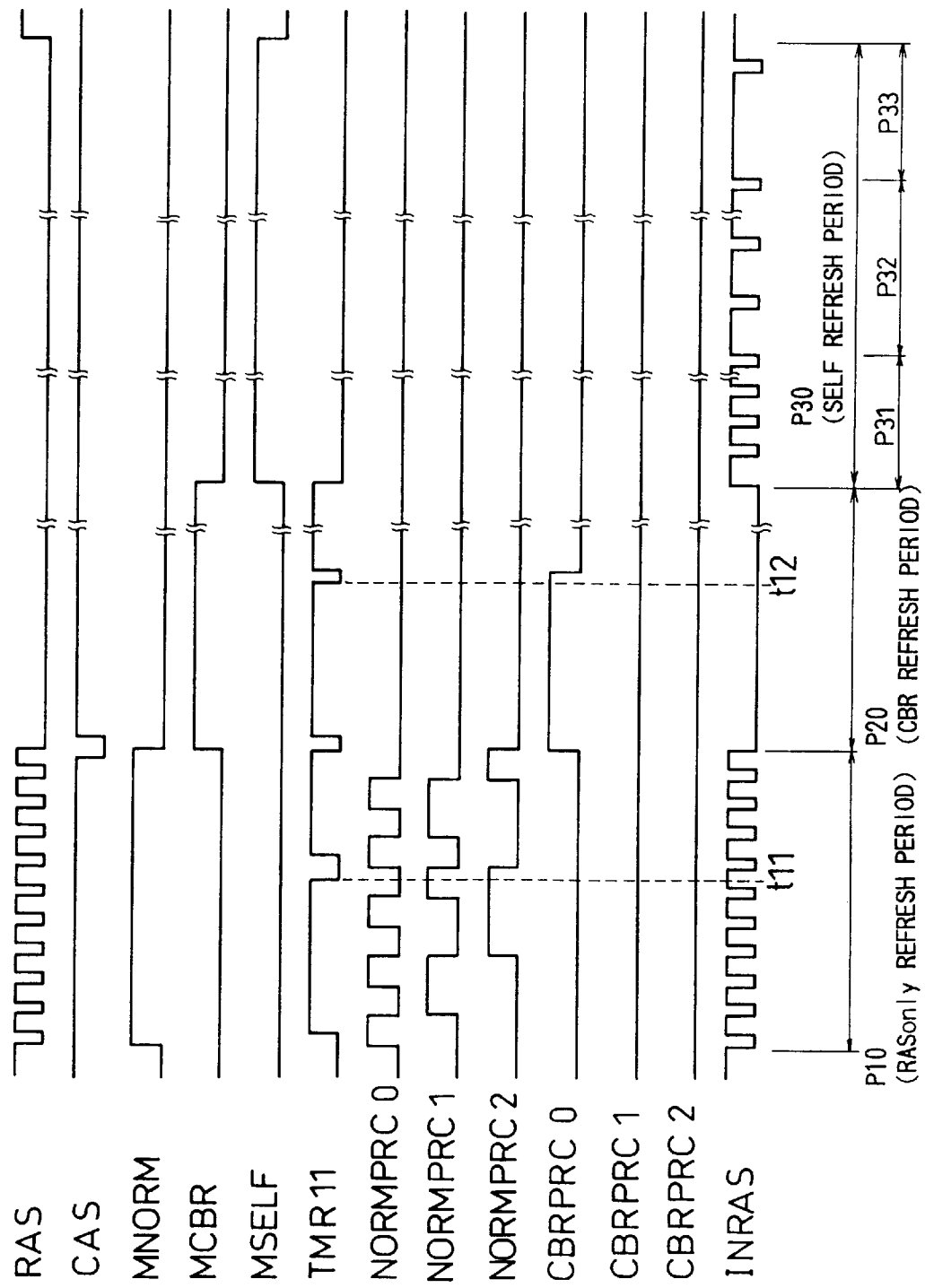
FIG. 2 is a timing chart of each signal as it is when an operation cycle of a signal RAS is short in the semiconductor memory device according to the preferred embodiment.
Figure 3:
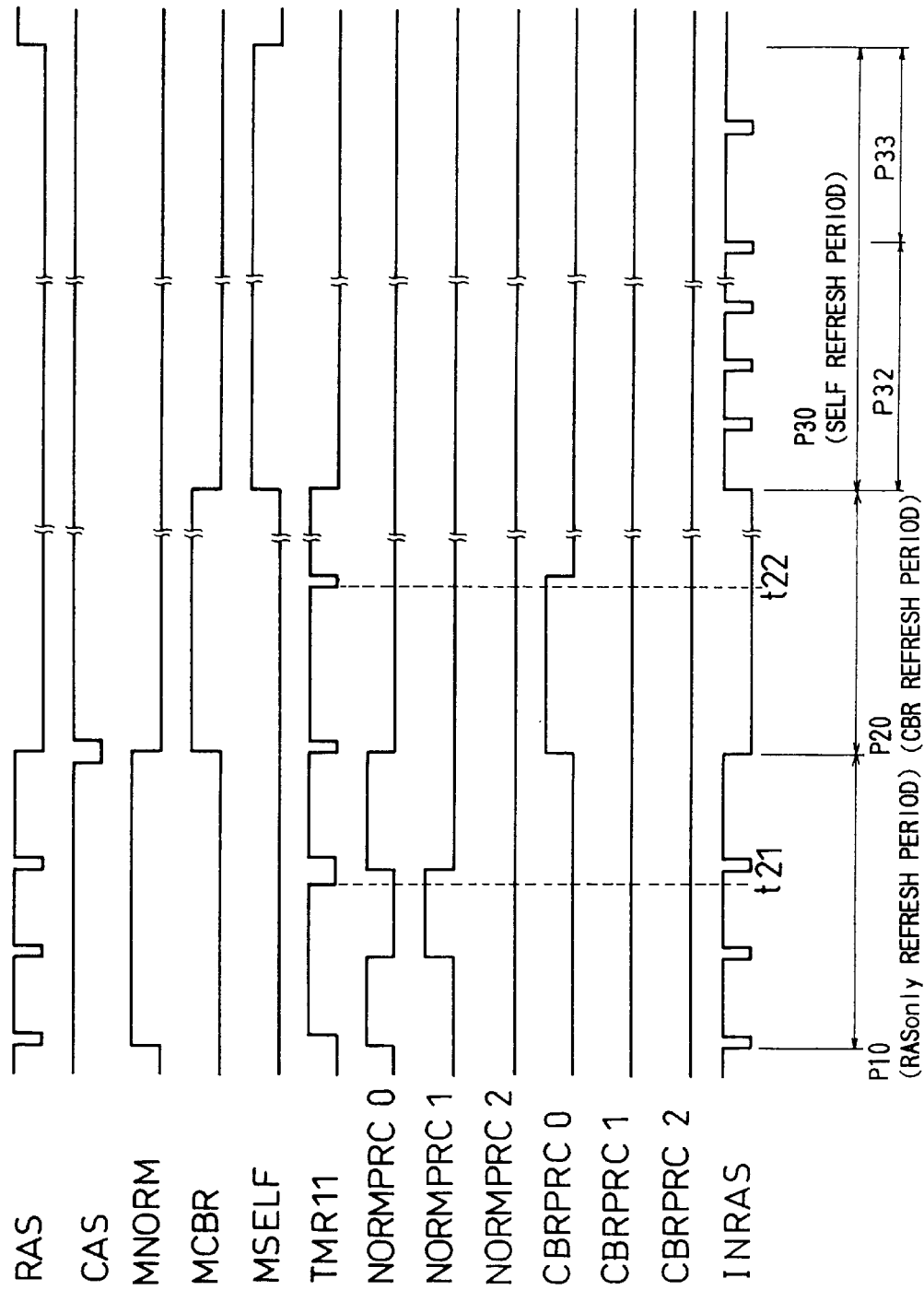
FIG. 3 is a timing chart of each signal as it is when the operation cycle of the signal RAS is long in the semiconductor memory device according to the preferred embodiment.

FIGS. 2 and 3 are timing charts of the respective signals RAS, CAS, MNORM, MCBR, MSELF, TMR11, NORMPROC0–2, CBRPRC0–2, and INRAS. Processes in which the respective signals are generated, cycles and the like of the respective signals will be described later. First, only relationships between inputting and outputting of each signal within each circuit will be described.

In the circuit shown in FIG. 1, the signal RAS and the signal CAS are externally inputted to the RAS only refresh and normal read/write detection circuit 111, the CBR refresh detection circuit 112 and the self refresh detection circuit 113 which are disposed within the mode detection circuit 110. Further, the RAS only refresh and normal read/write detection circuit 111 generates the signal MNORM. The signal MNORM is supplied to the internal timer 114, the external cycle count circuit 115, and the internal RAS signal generating circuit 121. The CBR refresh detection circuit 112 generates the signal MCBR. The signal MCBR is supplied to the internal timer 114, the external cycle count circuit 115, and the CBR refresh signal generating circuit 116. The self refresh detection circuit 113 generates the signal MSELF. The signal MSELF is supplied to the self refresh signal generating circuit 117 and the second internal timer 118.

Next, the first internal timer 114 generates the signal TMR11 in response to the two signals MNORM and MCBR. This signal is supplied to the external cycle count circuit 115. The external cycle count circuit 115, in response to the three signals TMR11, MNORM and MCBR, generates 3-bit signals NORMPROC0–2 and CBRPROC0–2 each expressing the speed of the signal RAS which is externally inputted. The signals NORMPROC0–2 and CBRPROC0–2 are supplied to the self refresh signal generating circuit 117. The signal CBRPROC0–2 is also supplied to the CBR refresh signal generating circuit 116. Further, the signal RAS or CAS which is externally inputted is also directly or indirectly supplied to the first internal timer 114, the external cycle count circuit 115, the CBR refresh signal generating circuit 116, the self refresh signal generating circuit 117, and the internal RAS signal generating circuit 121.

As described later, the external cycle count circuit 115, functioning as operation cycle detecting means for detecting an operation cycle of the signal RAS which is externally inputted, generates the 3-bit signals NORMPROC0–2 and CBRPROC0–2 as a detection result on the operation cycle of the signal RAS which is externally inputted.

On the other hand, receiving the signal MSELF, the second internal timer 118 generates the signal TMR21 which sets a cycle for performing self refresh. The signal TMR21 is directly supplied to the self refresh signal generating circuit 117. The signal TMR 21 is divided sequentially by the frequency-divider circuits 119 and 120, and the resultant signals TMR22 and TMR23 are each supplied to the self refresh signal generating circuit 117.

Receiving the signals CBRPROC0–2 and MCBR, the CBR refresh signal generating circuit 116 generates the signal CCBR. The signal CCBR is supplied to the internal RAS signal generating circuit 121. The self refresh signal generating circuit 117, receiving the signals NORMPROC0–2, CBRPROC0–2, MCBR, and TMR21 to TMR23, generates the signal CSELF. The signal CSELF is supplied to the internal RAS signal generating circuit 121. The internal RAS signal generating circuit 121, in response to the signals MNORM, CCBR and CSELF, generates the signal INRAS which serves as a refresh instruction signal. The signal INRAS is supplied to memory cells and the like. The CBR refresh signal generating circuit 116, the self refresh signal generating circuit 117 and the internal RAS signal generating circuit form instruction signal generating means for generating the signal INRAS which serves as the refresh instruction signal. Although omitted in FIG. 1, the semiconductor memory device further includes a memory cell array which is formed by arranging a number of memory cells and a control circuit which functions as refresh means for supplying a current for holding data to the respective memory cells in response to the signal RAS.

Next, operations within the circuit as described above will be described with reference to FIGS. 2 and 3.

FIG. 2 is a timing chart of each signal as it is when an operation cycle of the signal RAS is short. In FIG. 2, a long period P10 is a RAS only refresh period of the signal INRAS. This is a mode in which the signal MNORM outputted from the RAS only refresh and normal read/write detection circuit 111 stays at a logic voltage "H." A period P20 of the signal INRAS is a CBR refresh period. This is a mode in which the signal MCBR outputted from the CBR refresh detection circuit 112 stays at the logic voltage "H." The CBR refresh period P20 starts after the signal CAS changes to the logic voltage "L" and the signal RAS changes to the logic voltage "L" to invoke a self refresh mode.

Further, after a certain period of time since the CBR refresh period P20 started, the signal MSELF outputted the self refresh detection circuit 113 changes to the logic voltage "H." At a rise of the signal MSELF, a self refresh period P30 in which the internal signal INRAS automatically performs refresh starts. In the present preferred embodiment, the self refresh period P30 consists of partial periods P31 to P33, the cycle of the internal signal INRAS becomes progressively longer during the partial periods P31, P32 and P33 in this order. While a normal operation cycle is about 200 nsec, a data holding time is 200 msec, and a data holding time of a DRAM is about 106 times as long as the normal operation cycle. Although FIG. 2 shows a difference between the normal operation cycle and the self refresh cycle is only small for convenience of illustration, the self refresh cycle is about 1000 times as long as the normal operation cycle.

During the RAS only refresh period P10 above, refresh is performed with the same cycle as the signal RAS which is externally inputted. In the example shown in FIG. 2, since the operation cycle of the signal RAS is short, RAS only refresh is performed in a short cycle. In the present preferred embodiment, operations are similar between a normal read/write period, which is the normal operation cycle, and the RAS only refresh period P10.

Further, in the present preferred embodiment, responding to the signal TMR11 from the first internal timer 114, the external cycle count circuit 115 which functions as the operation cycle detecting means changes described earlier the value of the 3-bit signal NORMPROC0–2 at a RAS only refresh time t11.

Since FIG. 2 shows a case in which the RAS only refresh operation before entering the self refresh mode is at a high speed, in the external cycle count circuit 115, the 3-bit signal NORMPROC0–2 at time t11 is a signal which expresses a large numerical value. In other words, at the time till, the most significant signal NORMPROC2 has the logic voltage "H," the signal NORMPROC1 has the logic voltage "H," and the signal NORMPROC0 has the logic voltage "L." Since the value of the signal NORMPROC0–2 is large, the self refresh signal generating circuit 117 generates a signal which is based on the signal TMR21 having a cycle which is not divided, as a self refresh cycle (i.e., the cycle of the internal signal INRAS) for the period P31 under the self refresh mode. Entering the period P32 starts after a predetermined period of time, the self refresh signal generating circuit 117 generates the signal TMR22 having a cycle twice as long as that of the signal TMR21, as the self refresh cycle. Entering the period P33 after a predetermined period of time, the self refresh signal generating circuit 117 generates a signal which is based on the signal TMR23 having a cycle which is four times as long as that of the signal TMR21, as the self refresh cycle.

Hence, in self refresh control according to the present embodiment, since the self refresh cycle is controlled so as to become progressively longer after a certain period of time during the self refresh period, a consumption current during the self refresh operation eventually becomes about ¼ of a conventional consumption current. On the other hand, since the data holding time becomes longer as described later as the self refresh cycle becomes longer, even if the self refresh cycle becomes gradually longer, this does not damage a data holding function.

Next, FIG. 3 is a timing chart showing a case where the operation cycle of the signal RAS is long, i.e., during low-speed operations. As shown in FIG. 3, during the RAS only refresh period P10, RAS only refresh is performed within a longer cycle than in the case shown in FIG. 2. That is, the operation is performed at a low speed. Since the RAS only refresh operation before entering the self refresh mode is performed at a low speed, the numerical value which is expressed by the 3-bit signal NORMPROC0–2 at a time t21 defined by the signal TMR11 from the first internal timer 114 is small. In other words, the most significant signal NORMPROC2 has the logic voltage "L," the signal NORMPROC1 has the logic voltage "H," and the signal NORMPROC0 has the logic voltage "L." Since the value of the signal NORMPROC0–2 is small, the self refresh cycle during the period P32 under the self refresh mode becomes a signal which is based on the signal TMR22 having a cycle which is twice as long as that of the signal TMR21, from the beginning. Following this, in the period P33 after a certain time, the self refresh cycle becomes a signal which is based on the signal TMR23 having a cycle which is four times as long as that of the signal TMR21.

Hence, when the operation is performed at a low speed during the RAS only refresh period shown in FIG. 3, since the self refresh cycle immediately after entering the self refresh mode is ½ of that in a case where the operation is performed at a high speed during the RAS only refresh period shown in FIG. 2, from the beginning, there is no the period P31 which has a short cycle, and therefore, a consumption current is further reduced. The effect of reducing a consumption current is particularly noticeable during operations in which a normal operation, such as RAS only refresh, self refresh and normal read/write, and a self refresh operation frequently switch with each other.

Figure 4:
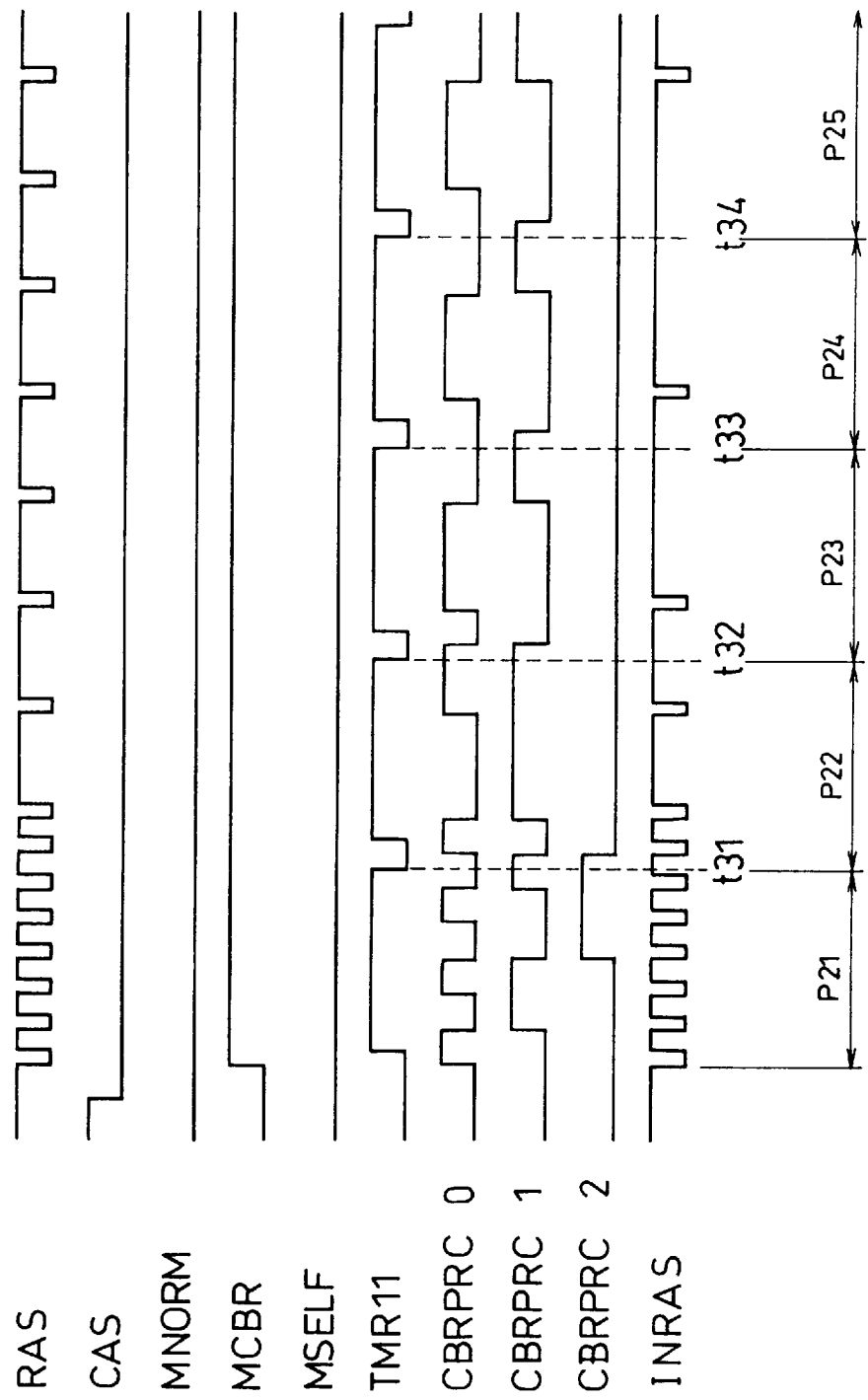
FIG. 4 is a timing chart showing the details of a method of controlling each signal during CBR refresh in the semiconductor memory device according to the preferred embodiment.

Next, a description will be given on the details of a method of controlling the refresh cycle during the CBR refresh period P20. FIG. 4 is a timing chart, magnifying a part which corresponding to the CBR refresh period P20 shown in FIG. 2 or 3. In FIG. 4, the CBR refresh period P20 includes partial periods P21 to P25. The partial period P21 is a CBR refresh period of a high speed operation, while the partial periods P22 to P24 are CBR refresh periods of a low speed operation.

First, it is assumed that while high-speed CBR refresh is performed during the partial period P21, at an end time t31, a high-speed operation is detected from the value of the signal NORMPROC0–2. In this case, the internal signal INRAS is a signal which has the same cycle with the signal RAS which is externally inputted. Hence, the cycle of the externally inputted signal RAS becomes long during the partial period P22 to slow down the operation, whereby the cycle of the internal signal becomes long in synchronization to the cycle of the externally inputted signal RAS.

If it is detected at an end time t32 of the partial period P22 that the operation is a slow-speed operation, in the next partial period P23, since it is detected that the operation is a slow-speed operation during the precedent partial period P22, the internal signal INRAS is generated for every other signal RAS which is externally inputted. That is, although the time at which the internal signal INRAS is outputted itself is the same as the time at which the signal RAS is outputted, it is not always the case that the internal signal INRAS is outputted every time the signal RAS is outputted. In other words, although a CBR refresh instruction signal is generated from the signal RAS which is externally inputted in response to the internal signal INRAS, when it is detected that the operation cycle of the signal RAS is long, the device is controlled so that the CBR refresh instruction signal is generated in synchronization to only a part of the signal RAS which is externally inputted. This is the same in the next partial period P24.

In the next partial period P25, if it is detected at an end time t34 of the precedent partial period P24 that the operation is still a slow-speed operation, the device is controlled so that the internal signal INRAS is generated for every three signals RAS which are externally inputted. That is, a pulse number for not generating the CBR refresh instruction signal within the externally inputted signal RAS.

Hence, in the present embodiment, when the operation cycle of the signal RAS which is externally inputted becomes long, the device is controlled so that a period is created having a cycle which is not the same as the operation cycle of the externally inputted signal RAS and which does not cause CBR refresh, i.e., so that the device operates at a low speed. When CBR refresh becomes slow, since a consumption current and an internal temperature of the device are reduced, a data holding time of the memory cells becomes long and an actual refresh cycle becomes long. Since the consumption current is further reduced when the actual refresh cycle becomes long in this manner, a margin to the data holding time of the memory cells increases. In this embodiment, since the actual refresh cycle appears every other externally inputted signal RAS or every three externally inputted signals RAS, consumption power becomes ½ or ⅓.

While the present embodiment requires that a 3-bit signal is outputted as the signals NORMPRC0–2 and CBRPRC0–2 which express a detection result on the operation cycle by the external cycle count circuit 115, the self refresh operation cycle is extended up to four times in accordance with this signal and the CBR refresh cycle is extended up to every three externally inputted signals RAS, the present invention is not limited to such a preferred embodiment. Rather, finer control is possible.

Further, although the basic CBR refresh cycle, which is defined as a cycle which is twice as long as the operation cycle of the signal RAS which is externally inputted, is changed to a cycle which is further twice or three times longer in the present embodiment, the basic CBR refresh cycle may be changed to a long CBR refresh cycle which is separated from the cycle of the signal RAS which is externally inputted. In this case as well, by changing in the CBR refresh cycle more largely than a change in the externally inputted signal RAS, it is possible to reduce consumption power while maintaining a data holding function under a condition that the semiconductor memory device operates very frequently or very scarcely.

Next, a description will be given on a relationship between the operation speed, i.e., the operation cycle of the semiconductor memory device, the internal temperature of the device and the data holding time.

Figure 5:
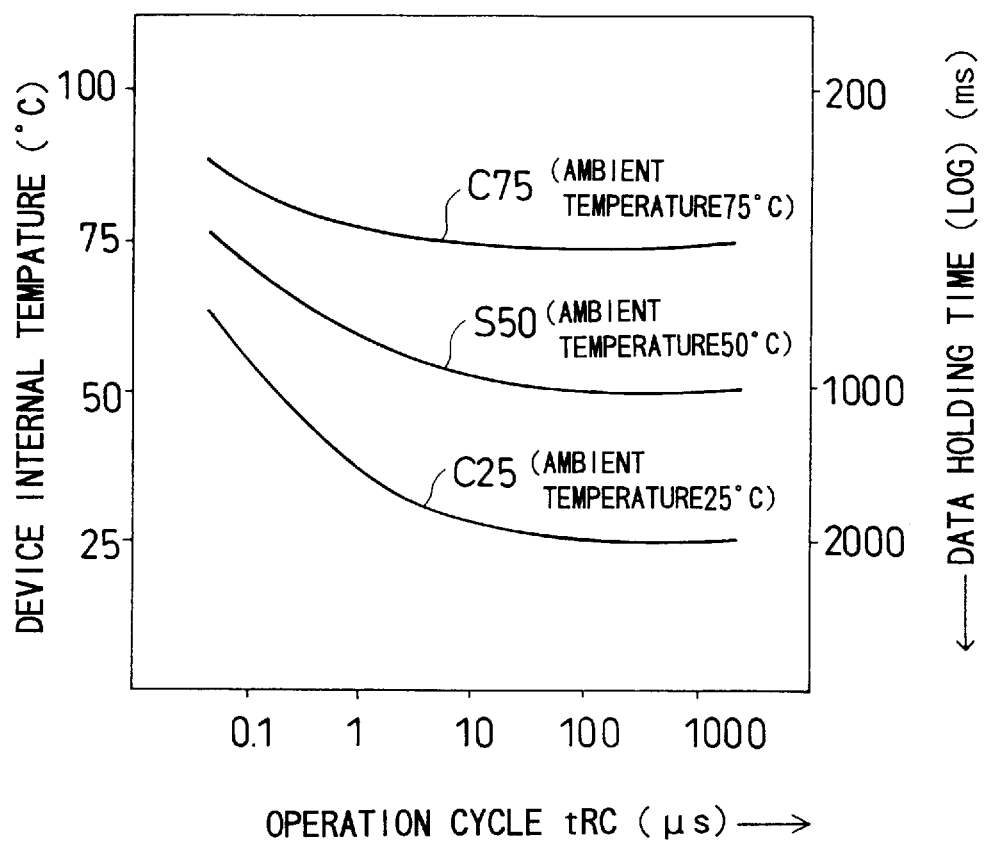
FIG. 5 is a characteristic diagram showing a relationship between an operation cycle, an internal temperature and a data holding time of a semiconductor memory device.
Figure 6:
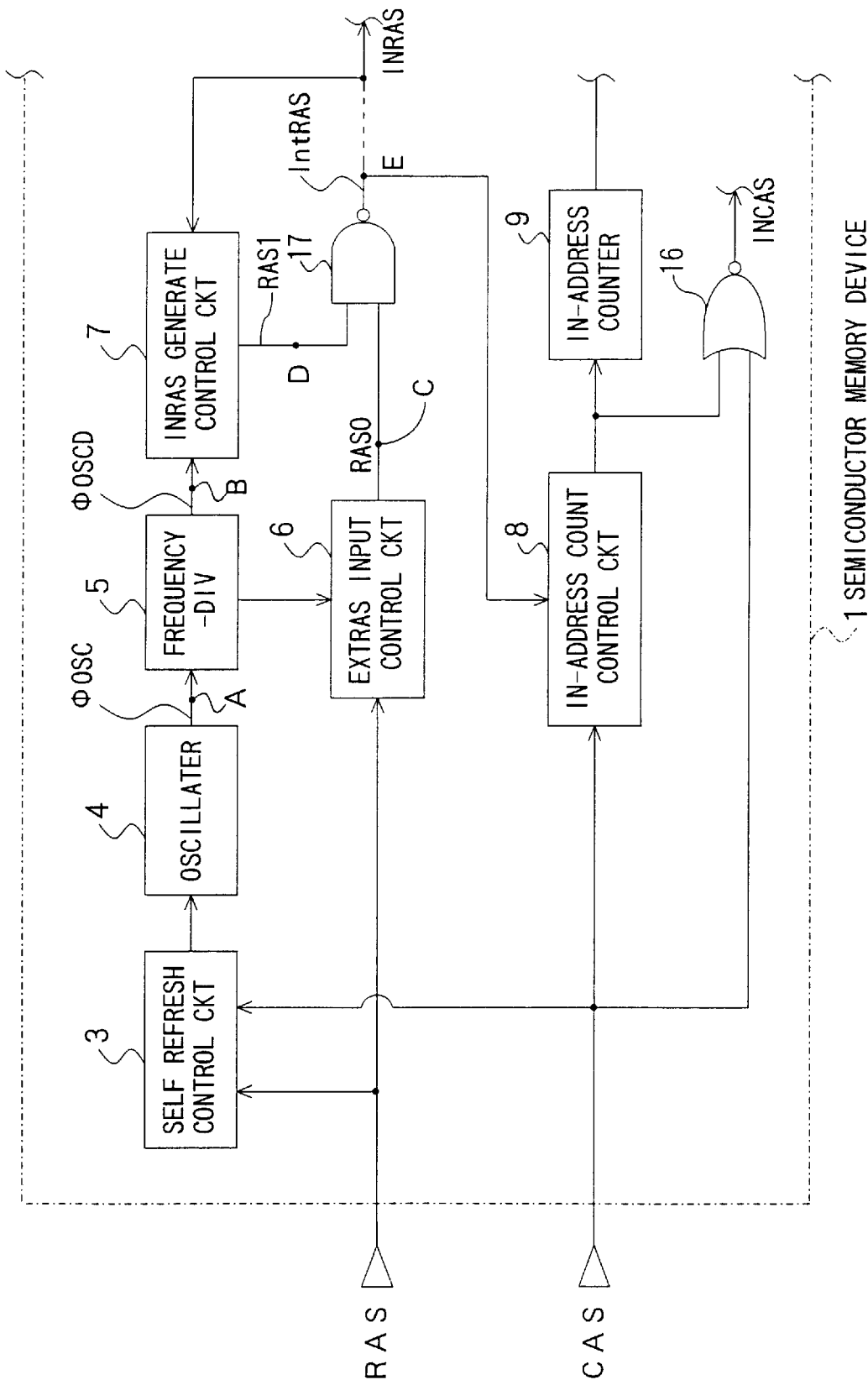
FIG. 6 is a block diagram showing a part of a conventional semiconductor memory device which performs a self refresh function.

FIG. 5 is a characteristic diagram showing the relationship between the operation cycle, the internal temperature and the data holding time, using an ambient temperature as a parameter. In FIG. 5, the horizontal axis shows the operation cycle tRC, the vertical axis on the left-hand side shows the internal temperature of the device, and the vertical axis on the right-hand side shows the data holding time. The characteristic curves C25, C50 and C75 are characteristic curves corresponding to cases where the ambient temperature is 25° C., 50° C. and 75° C., respectively. In either case, the operation cycle becomes shorter, and the internal temperature of the device increases when the device operates at a high speed. On the other hand, when the operation cycle tRC becomes long, the internal temperature of the device decreases and the data holding time becomes long.

While the present embodiment requires that the operation cycle is detected to control the actual refresh cycle so that consumption power is reduced, this may be combined with other controlling in which the internal temperature of the device is directly detected to control the refresh cycle. In short, by controlling the semiconductor memory device while utilizing a parameter which influences the internal temperature of the device, it is possible to reduce consumption power, improve the operation speed, etc.

For example, it is possible to control a delay time of a delay circuit which is disposed in the semiconductor memory device, using a signal which is detected by the operation cycle detecting means. For instance, since the internal temperature increases and a delay time of a delay circuit becomes long as an operation time of the semiconductor memory device becomes short, using a signal which is detected by the operation cycle detecting means, it is possible to structure the circuitry which shortens the delay time.

Further, while there are a reference voltage signal from a reference voltage generating circuit, an input switching level and the like for a circuit having a temperature characteristic, such a signal or level can be corrected in accordance with the operation cycle of the externally inputted signal.

What is claimed is:

1. A semiconductor memory device, comprising:
   a memory part;
   a control part for controlling writing of data in said memory part, reading of data from said memory part, holding of data in response to a signal which is externally inputted; and
   operation cycle detecting means for detecting an operation cycle of the signal which is externally inputted.

2. The semiconductor memory device of claim 1, wherein said semiconductor memory device is a DRAM,
   said control part is structured so as to perform a RAS only refresh operation in response to a signal RAS which is externally inputted, and
   said operation cycle detecting means is structured so as to detect an operation cycle of said signal RAS during the RAS only refresh operation.

3. The semiconductor memory device of claim 1, wherein said semiconductor memory device is a DRAM,
   said control part is structured so as to perform a CAS before RAS auto-refresh (CBR refresh) operation in response to a signal RAS and a signal CAS which are externally inputted, and said operation cycle detecting means is structured so as to detect an operation cycle of said signal RAS during said CBR refresh operation.

4. A semiconductor memory device which functions as a DRAM, comprising:

a memory part;

a control part for controlling writing of data in said memory part, reading of data from said memory part, holding of data in response to a signal which is externally inputted; and self refresh means for performing refresh asynchronously to said signal which is externally inputted, wherein the self refresh means gradually extends each self refresh cycle after a certain period of time during a self refresh operation.

5. A semiconductor memory device which functions as a DRAM, comprising;

a memory part;

a control part for controlling writing of data in said memory part, reading of data from said memory part, holding of data in response to a signal which is externally inputted;

operation cycle detecting means for detecting an operation cycle of the signal which is externally inputted; and self refresh means for performing refresh asynchronously to the signal which is externally inputted, wherein said self refresh means selects one of said plurality of self refresh cycles in accordance with an operation cycle of an externally inputted signal which is detected by said operation cycle detecting means during a self refresh operation.

6. The semiconductor memory device of claim 5, wherein said self refresh means is structured to select a longer self refresh cycle as the operation cycle of said signal which is externally inputted is longer.

7. The semiconductor memory device of claim 5, wherein said signal which is externally inputted is RAS.

8. A semiconductor memory device which functions as a DRAM, comprising;

a memory part;

a control part for controlling writing of data in said memory part, reading of data from said memory part, holding of data in response to a signal which is externally inputted;

operation cycle detecting means for detecting an operation cycle of the signal which is externally inputted; and self refresh means for performing refresh asynchronously to said signal which is externally inputted, wherein said self refresh means selects one of said plurality of self refresh cycles in accordance with an operation cycle of an externally inputted signal which is detected by said operation cycle detecting means at the beginning of a self refresh operation, and gradually extends each self refresh cycle after a certain period of time during the self refresh operation.

9. The semiconductor memory device of claim 7, wherein said signal which is externally inputted is RAS.

10. A semiconductor memory device which functions as a DRAM, comprising:

a memory part;

a control part for controlling writing of data in said memory part, reading of data from said memory part, holding of data in response to a signal which is externally inputted;

operation cycle detecting means for detecting an operation cycle of said signal which is externally inputted; and CBR refresh means for performing CBR refresh in a basic cycle which is determined in accordance with an operation cycle of an externally inputted signal, wherein in response to the specific operation cycle of the externally inputted signal which is detected by said operation cycle detecting means during a CBR refresh operation, said CBR refresh means performs the CBR refresh operation in a cycle which is obtained by changing said basic cycle.

11. The semiconductor memory device of claim 10, wherein said CBR refresh means is structured so as to change a cycle for performing said CBR refresh operation more largely than a change in the operation cycle which is detected by said operation cycle detecting means.

12. The semiconductor memory device of claim 10, wherein said signal which is externally inputted is RAS.

13. A semiconductor memory device, comprising;

a memory part;

a control part for controlling writing of data in said memory part, reading of data from said memory part, holding of data in response to a signal which is externally inputted;

operation cycle detecting means for detecting an operation cycle of said signal which is externally inputted;

refresh means for performing refresh for holding data which are stored in said memory part; and instruction signal generating means for generating a refresh instruction signal which operates said refresh means, wherein said instruction signal generating means changes a cycle of the refresh instruction signal so that a frequency of refresh becomes smaller as an operation cycle of an externally inputted signal which is detected by said operation cycle detecting means becomes longer.

* * * * *